United States Patent [19]
Huang

[11] Patent Number: 5,835,515
[45] Date of Patent: Nov. 10, 1998

[54] HIGH POWER SEMICONDUCTOR LASER ARRAY

[75] Inventor: Sun-Yuan Huang, Blandon, Pa.

[73] Assignee: Lucent Technologies Inc., Murray Hills, N.J.

[21] Appl. No.: 736,698

[22] Filed: Oct. 25, 1996

[51] Int. Cl.⁶ ............................... H01S 3/04; H01S 3/091
[52] U.S. Cl. ............................................. 372/36; 372/75
[58] Field of Search ................................ 372/36, 50, 108, 372/75, 44, 34

[56] References Cited

U.S. PATENT DOCUMENTS

| | | | |
|---|---|---|---|
| 4,716,568 | 12/1987 | Scifres et al. | 372/36 |
| 4,856,015 | 8/1989 | Matsui | 372/50 |
| 5,001,719 | 3/1991 | Trussell | 372/50 |

FOREIGN PATENT DOCUMENTS

| | | | |
|---|---|---|---|
| 61-148891 | 7/1986 | Japan | 372/36 |
| 1-23592 | 1/1989 | Japan | 372/36 |
| 2-177583 | 7/1990 | Japan | 372/36 |

*Primary Examiner*—Rodney B. Bovernick
*Assistant Examiner*—Luong-Quyen T. Phan

[57] ABSTRACT

A two dimensional semiconductor laser array comprises a heat conducting base plate. A plurality of laser bars, having laser diodes stacked adjacent each other, are disposed in between a plurality of heat spreader plates and over the heat conducting base plate. Two spaced apart sidewalls are disposed on the heat conducting base plate, such that the heat spreader plate is thermally connected to said two sidewalls. The laser bars and the heat spreader plates are stacked upon each other, such that each heat spreader plate is disposed in between two of the laser bars.

20 Claims, 8 Drawing Sheets

300

HIGH POWER SEMICONDUCTOR LASER ARRAY

FIELD OF THE INVENTION

This invention relates to laser sources and more specifically to a high power laser source employed in industrial applications and long distance communications.

BACKGROUND OF THE INVENTION

Semiconductor lasers have become desirable for use in high power laser applications. Because a single semiconductor laser may not generate sufficient power, currently high power semiconductor laser sources, generating high optical power, in the order of one watt or more, are made of semiconductor laser arrays. Such high power laser arrays have been employed in applications such as optical storage, printing and communications. Recent advances in development and use of cladding pump fiber lasers and amplifiers has further stimulated the need for high power two-dimensional semiconductor laser arrays. These arrays are made of single stripes of semiconductor lasers, and are sometimes stacked to form two dimensional laser arrays. However conventional two-dimensional semiconductor laser arrays have many shortcomings as discussed hereinafter.

Typically, prior art semiconductor laser arrays employ multiple transverse mode lasers, having a substantial broad area with aperture sizes in the order of 100 or 200 μm. Some of the disadvantages of multiple transverse mode lasers include low brightness, significantly high failure rates, low electrical to optical conversion efficiency and relatively low thermal performance. For example, because the semiconductor material forming the aperture of a laser includes manufacturing imperfections, semiconductor lasers with substantially large aperture size are subject to relatively high incidents of failure.

Furthermore, the stacking arrangement of currently available two-dimensional semiconductor laser arrays provides for less than satisfactory thermal performance. To this end, complex heat sinking arrangements have been employed to overcome relatively poor thermal performance and to maintain the system operating temperature at an acceptable level. For example, FIG. 1 illustrates a semiconductor laser array 10 employing a plurality of laser diodes 12. In order to maintain a desirable operating temperature range, a complex heat sinking arrangement is employed, including bar bond plates 14, which are disposed adjacent to each laser diode 12. Furthermore, each laser diode is electrically coupled to an insulated wirebond plate 17 via a wirebond arrangement 16. Finally, bar bond plates 14 are coupled to an insulator plate 18, which in turn is disposed on a heatsink plate 20.

For substantially high energy laser diodes, even the heat sinking arrangement of FIG. 1 may not be sufficient. To this end, it may become necessary to employ a liquid cooling package 26 as illustrated in FIG. 2. Two liquid coolant tubes 28 and 30 carry coolant liquid to and from the semiconductor laser assembly 10. This results in higher manufacturing cost and lower reliability.

Thus, there is a need for a semiconductor laser array that exhibits desirable thermal performance, with substantially high degree of reliability.

SUMMARY OF THE INVENTION

Briefly, in accordance with one aspect of the invention a semiconductor laser array comprises a heat conducting plate, which is electrically insulated; at least one laser bar having a plurality of semiconductor lasers arranged in a row disposed on the heat conducting plate; a heat spreader plate disposed on the laser bar configured so as to conduct heat and electricity to and from the laser bar; at least one sidewall disposed on the heat conducting plate, such that the heat spreader is attached to the sidewall.

Briefly, in accordance with another aspect of the invention a method for manufacturing a semiconductor laser array comprises the steps of forming a heat conducting plate having a metallic layer disposed over its surface; forming a laser bar having a row of semiconductor lasers over the heat conducting plate; disposing a heat spreader plate over the laser bar, wherein the heat spreader plate is externally metallized on all sides; forming a next laser bar having a row of semiconductor lasers over the heat spreader plate; disposing a sidewall on each side of the base plate such that the heat spreader is attached to each sidewall at each end, and the laser bar is spaced apart from the sidewalls; heating the resulting structure to reform.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may be best understood by reference to the following detailed description when read with the accompanying drawings in which:

DETAILED DESCRIPTION OF THE DRAWINGS

Figure 1:
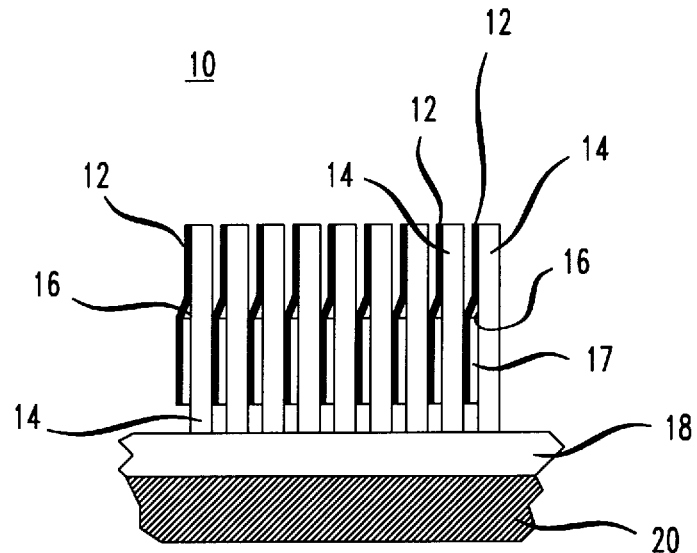
FIG. 1 illustrates a prior art heat sinking arrangement for a semiconductor laser array.
Figure 2:
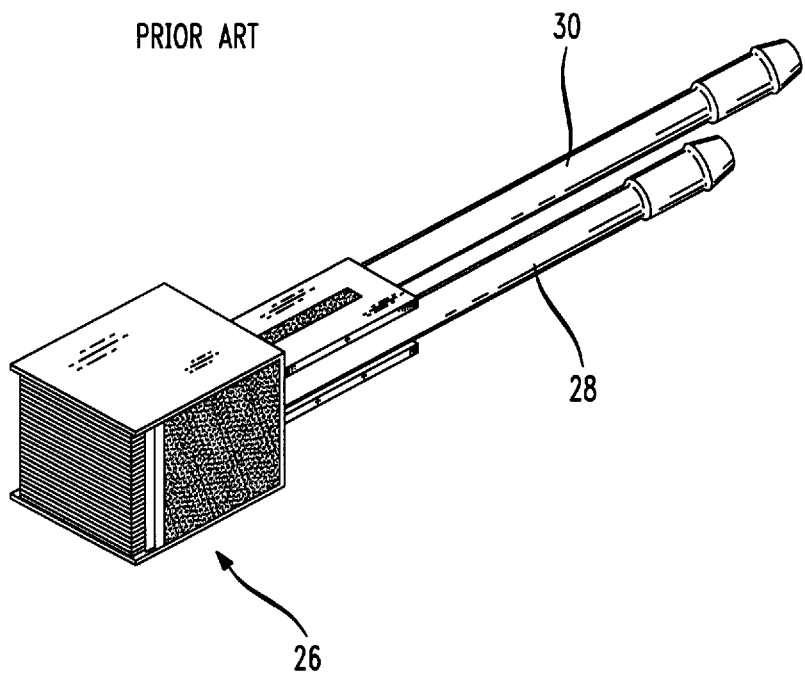
FIG. 2 illustrates another prior art heat sinking arrangement for a semiconductor laser array.
Figure 3:
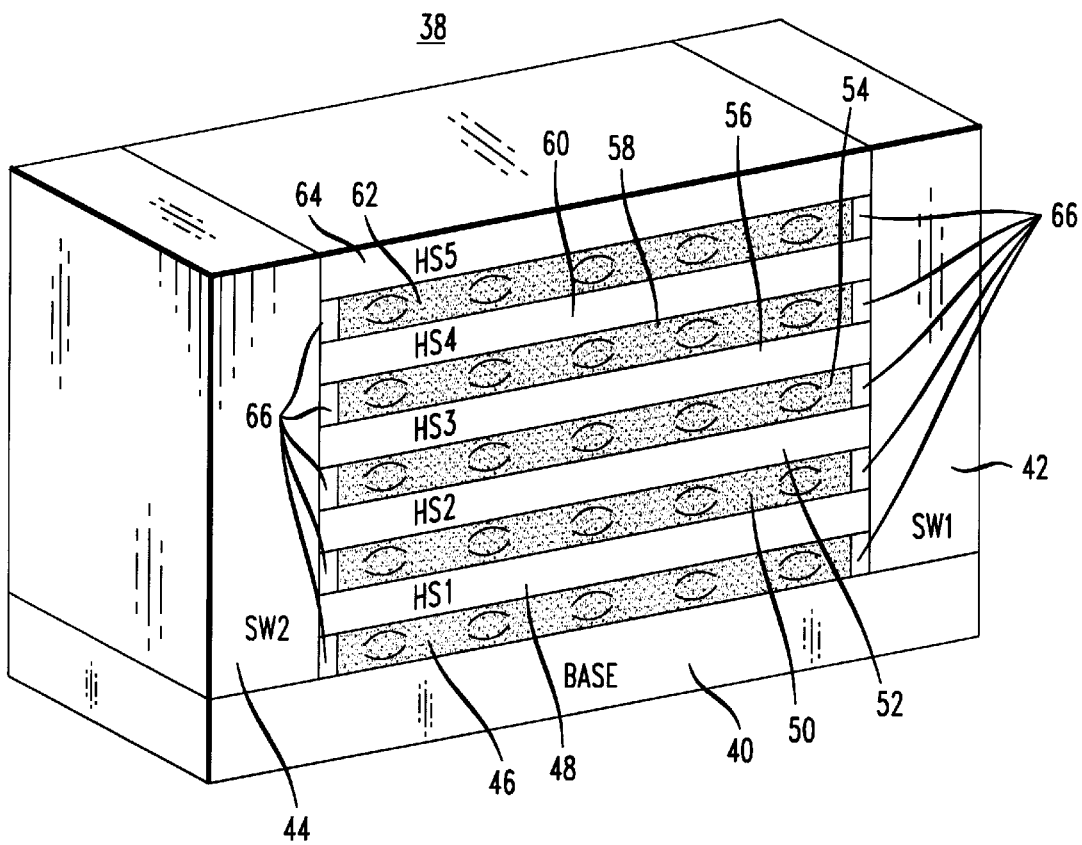
FIG. 3 illustrates a semiconductor laser array in accordance with one embodiment of the present invention.

FIG. 3 illustrates the physical layout of a 5×5 semiconductor laser array 38, in accordance with the present invention, although the invention is not limited in scope in that respect. For example, the number of individual lasers may be arranged in accordance with a given application and required reliability as will be discussed in more detail below.

Laser array 38 comprises five 1×5 laser bars 46, 50, 54, 58 and 62. Each laser bar includes five semiconductor laser diodes as will be explained in further detail below. Each one of the five laser diodes in each laser bar is configured in the form of a strip-geometry laser, as explained in more detail in reference with FIGS. 4a–4d. Laser bar 46 is disposed over a base plate 40. A heat spreader plate 48 is disposed over laser bar 46. Likewise, laser bars 50, 54, 58 and 62 are stacked upon each other with each heat spreader plate 52, 56, 60 and 64 configured to be disposed respectively in between two laser bars. Semiconductor laser array 38 further comprises two sidewalls 42 and 44 disposed on each side of base plate 40.

The height of the sidewalls is configured to be substantially equal to the height of the stack formed by laser bars 46, 50, 54, 58 and 62, and heat spreader plates 52, 56, 60 and 64 such that the top surface of laser array 38 is substantially flat. The width of each sidewall depends, among other things, on the laser array's thermal requirements, which in turn may depend on the electrical power of each laser, the current signal driving each laser, and the type and size of packaging intended to contain the laser array.

Each heat spreader is connected to the two sidewalls so as to form a thermal path, beginning from the heat spreader toward each sidewall 42 and 44 respectively, and finally toward the base plate 40. The laser bars are electrically isolated from the sidewalls. For example, the length of each laser bar is configured to define an air space 66, which extends along the entire width of the laser bar on each end.

Base plate 40, side walls 42, 44, and heat spreader plates 48, 52, 56, 60 and 64 are made of, for example, any ceramic material having a substantially high thermal conductivity. Advantageously, the thermal expansion of the base plate, the side walls and the heat spreader plates is substantially compatible to the thermal expansion of the material that forms the laser bars. In one embodiment of the invention, the base plate, the side walls and the heat spreader plates are made of Silicon Carbide (SiC) or Aluminum Nitride (AlN), and the laser bars are formed on a Gallium Arsenide (GaAs) substrate, although the invention is not limited in scope in that respect. For example, side walls 42 and 44 may be made of ceramic materials that are different from the materials used to form the base plate and the heat spreaders.

In accordance with one embodiment of the invention, semiconductor laser array 38 is made pursuant to an oven-reforming technique. Individual laser bars are preferably prepared, as explained in more detail in reference with FIG. 4. Thereafter, base plate 40 is prepared using a highly thermally conductive ceramic, such as SiC or AlN. The central portion of the base plate is configured so that it receives the first laser bar in a substantially tight arrangement. Each laser bar also includes a top and a bottom metalization layer for conducting heat and for solder bonding with the heat spreaders. The heat spreader plates are also preferably made of highly thermally conductive ceramic, such as SiC and AlN. Advantageously, the heat spreader plates are metallized on all sides, and coated with a soldered film on their top and bottom surfaces, for example by a vacuum evaporation technique. The side walls are preferably metallized and coated with a soldered film on all portions having a contact with the heat spreader plates and the base plate 40.

First laser bar 46 is then disposed over base plate 40. Thereafter, a first heat spreader plate 48 is disposed over laser bar 46. A second laser bar 50 is disposed over heat spreader plate 48. This process is repeated until a desired number of laser bars and heat spreaders have been stacked together. Side walls, 42 and 44 are then disposed over base plate 40 in order to provide a thermal path and a structural support for the laser assembly. The resulting structure is then placed in an oven and heated for reforming, resulting in a semiconductor laser array 38, as illustrated in FIG. 3. The assembly sequence is not limited to the above description. For example, the side walls can be placed over a base plate before stacking the laser bars and the heat spreaders.

The fabrication process of each laser bar, for example, laser bar 48 (FIG. 3) is described in reference with FIGS. 4a–4d. Typically, each laser bar, such as 48, comprises a plurality of semiconductor laser diodes. These laser diodes are preferably grown on a wafer 80 by common techniques, such as Metalorganic Chemical Vapor Deposition (MOCVD), Molecular Beam Epitaxy (MBE) or Liquid Phase Epitaxy (LPE). Preferably the wafer has a diameter ranging from one to 3 inches, although the invention is not limited in scope in that respect. The lasers are grown based on the stripe-geometry technique, to form, what is known as, edge emitting, single transverse mode laser described in *Long Wavelength Semiconductor Lasers*, G. P. Agrawal and N. K. Dutta, Chapt. 5 (Van Nostrand Reinhold Co., 1986), incorporated herein by reference. Typically, the active region of a stripe-geometry laser diode is essentially a rectangular box. This arrangement forms a resonant cavity for the laser radiation. As illustrated, the active area on the semiconductor wafer consists of equally-spaced laser diode stripes 86. Each stripe has a width of about a few micrometers and a thickness of about one micrometer. The space between stripes is about few hundred micrometers.

Figure 4A:
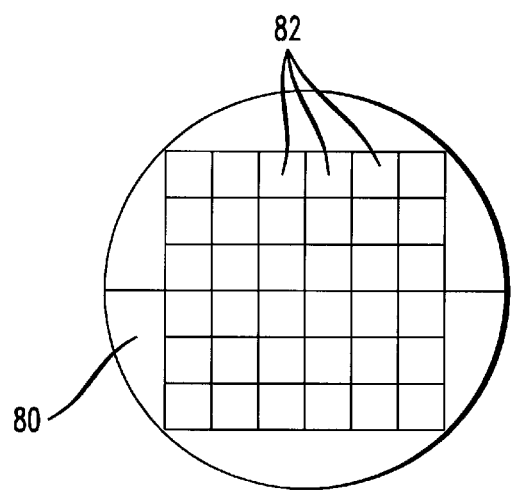
FIGS. 4A through 4D illustrates the process of forming a semiconductor laser array in accordance with one embodiment of the present invention.
Figure 4B:
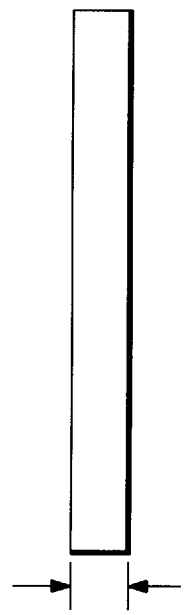
Figure 4C:
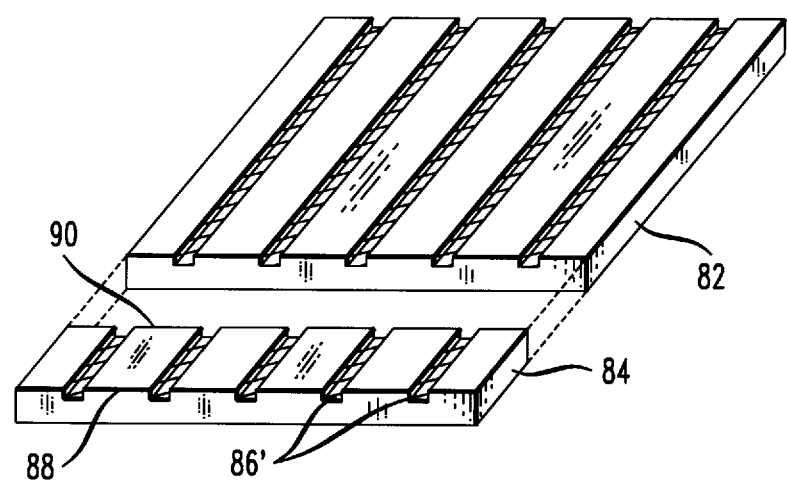

After all appropriate layers that form the laser diodes have been grown and processed, wafer 80 is thinned to a proper thickness of about 80 $\mu$m to about 120 $\mu$m and then sliced and cleaved into rectangular blocks 82, as illustrated in FIG. 4a and 4b, by employing a commonly known polishing, dicing and cleaving process. Each block 82 is then cleaved into laser bars 84, as illustrated in FIG. 4c. Each laser bar includes a plurality of laser diode stripes 86'. The end faces of each laser bar 84 is then coated with a high reflection layer 88 on one side and a low reflection layer 90 on the other side. This forms laser cavities for each laser stripe. The length of the laser cavity in each laser bar among other things, determines the oscillation frequency of the laser. Typical cavity lengths may preferably range from about 100 micrometers to about 1000 micrometers. Furthermore, each laser bar may have as many laser stripes as desired.

Figure 4D:
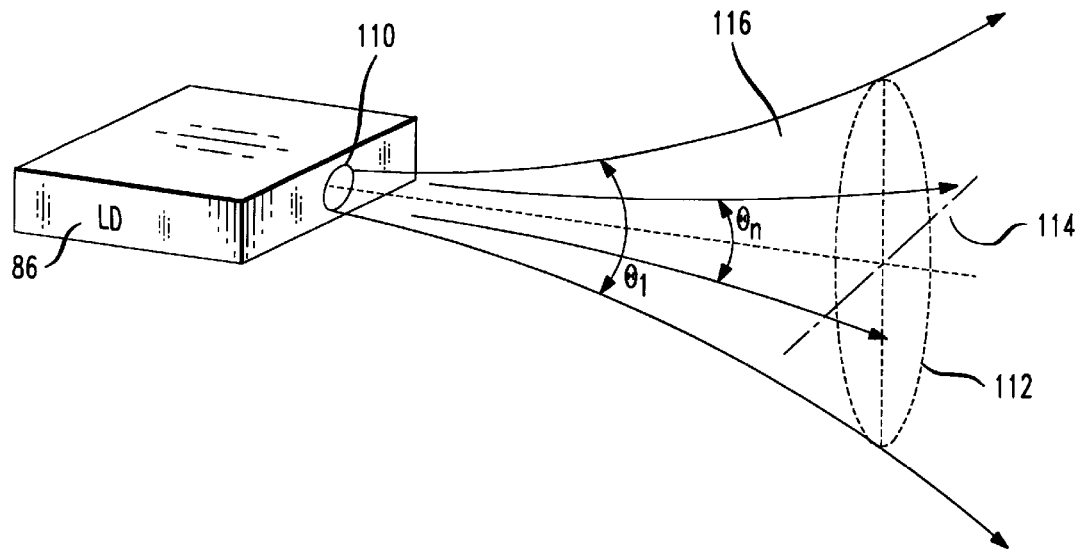

FIG. 4d illustrates the light emission from each laser diode stripe 86'. Laser light generated within the laser cavity of stripe 86' emits externally in two orthogonal planes from laser outlet 110. The laser outlet is typically in a shape of an oval or a rectangle with an approximate width w and an approximate height h. The laser emits light along a horizontal plane at an angle $\theta_{11}$, and along a vertical plane at an angle $\theta_1$. The emitted light forms a substantially elliptic light spot 112 on any given plane perpendicular to its direction of travel.

The two-dimensional semiconductor laser array in accordance with the principles of the present invention exhibits improved thermal performance and improved reliability compared to prior art two-dimensional laser array systems as explained in further detail below. For example, the current signal requirement of a two-dimensional laser array built in accordance with the present invention is less than that of the prior art systems. Furthermore, the failure rate of a two-dimensional laser array system in accordance with the present invention is remarkably lower than those systems previously employed.

Figure 5:
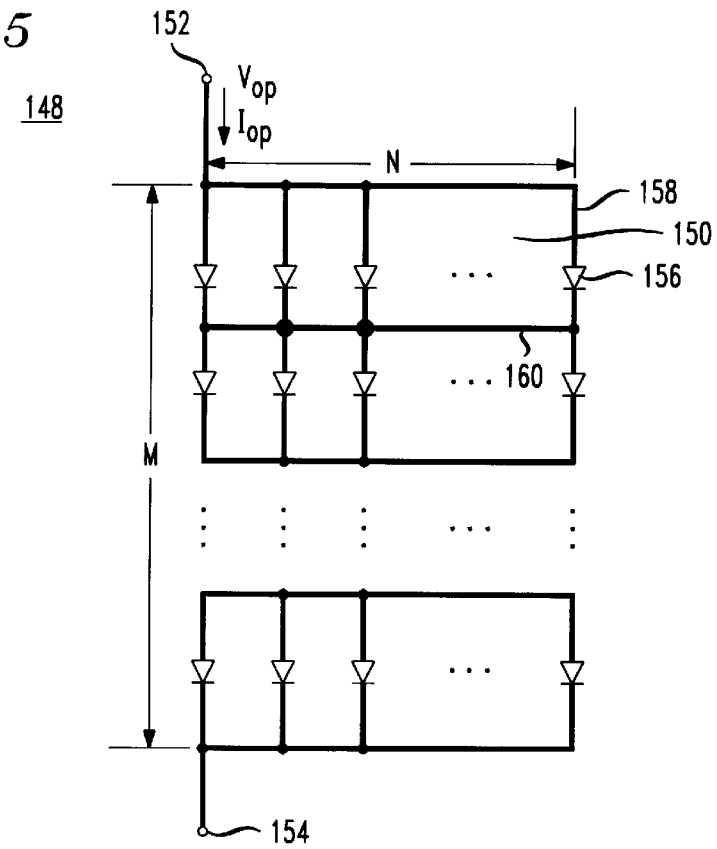
FIG. 5 illustrates a circuit diagram representing the electrical arrangement of a semiconductor laser array in accordance with one embodiment of the present invention.

FIG. 5 illustrates an electrical circuit 148 that is functionally equivalent to the operation of a two-dimensional N×M laser array such as 38 of FIG. 3, where N is the number of laser diodes 156 in each laser bar 150 and M is the number of laser bars stacked together in accordance with the principles of the invention described above. In one embodiment of the invention the number of laser diodes in each laser bar, N, is equal to the number of laser bars M, leading to an N×N semiconductor laser array. The heat spreader plates (FIG. 3) for each laser bar are shown as an electrical line, such as 158 and 160 in FIG. 5. As illustrated, laser diodes 156 of each laser bar are coupled together in parallel. Furthermore, laser diodes of separate laser bars are coupled together in series, such that the first laser diode in each row is coupled in series to the first laser in the following column.

An input terminal 152 is configured to receive an electrical signal so as to operate the laser diodes in each laser bar. The last column of laser array 148 is coupled, for example, to a ground terminal 154. Terminal 152 is further configured to receive an operating current signal, $I_{op}$, and an operating voltage signal $V_{op}$. The electrical characteristics of the semiconductor laser array illustrated in FIG. 5 is discussed in more detail hereinafter.

Assuming the lasers are substantially uniform, each laser diode 156 begins operating when it receives a threshold current signal $i_{th}$. Furthermore each laser diode 156 requires an operating current signal, $i_{op}$, and an operating voltage signal, $v_{op}$ and emits an operating optical power, $L_{op}$. Finally, the operating optical power of the semiconductor laser array is $L_{op}$.

For an N×N semiconductor laser array, in accordance with the principles of the present invention, the total threshold current signal is $$I_{th}=Ni_{th} \quad (1)$$

the total operating current signal is $$I_{op}=Ni_{op} \quad (2)$$

the total operating voltage signal is $$V_{op}=Nv_{op} \quad (3)$$

the total operating optical power is $$L_{op}=N^2 l_{op} \quad (4)$$

the total thermal power dissipation is $$P_{op}=I_{op}*V_{op}-L_{op} \quad (5)$$

and the total electrical-to-optical conversion efficiency is $$\eta_{EO}=L_{op}/(I_{op}*V_{op}) \quad (6)$$

As illustrated, because the laser stripes in each laser bar are coupled together in parallel, the total threshold current signal and the total operating current signal are a function of the number of laser stripes in each laser bar. To this end, the number of laser bars stacked together do not substantially affect the threshold and operating current signals. As a result, the semiconductor laser array, in accordance with the teachings of the present invention, drains substantially less current than prior art laser arrays.

Figure 6A:
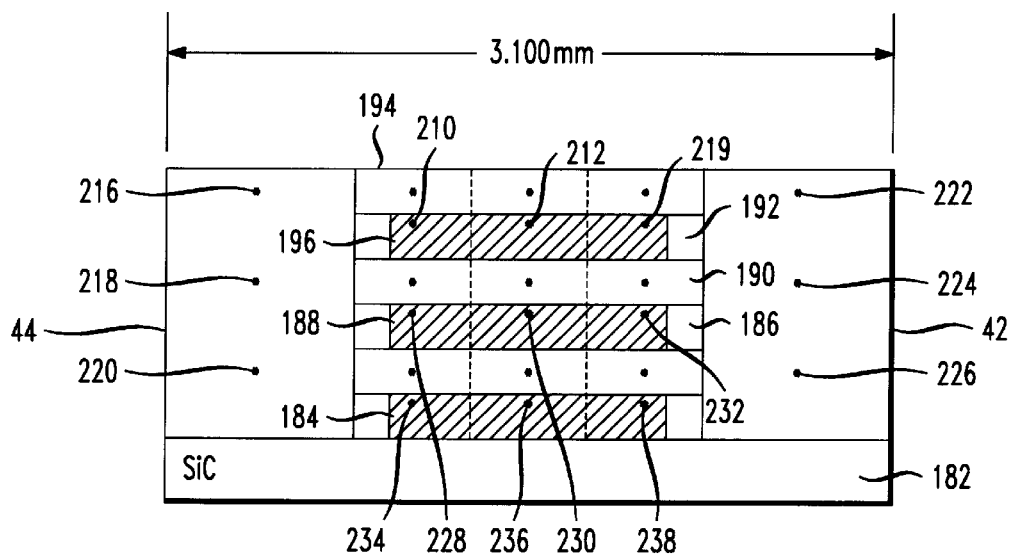
FIGS. 6A through 6D illustrates the thermal arrangement of a semiconductor laser array in accordance with one embodiment of the present invention.
Figure 6B:
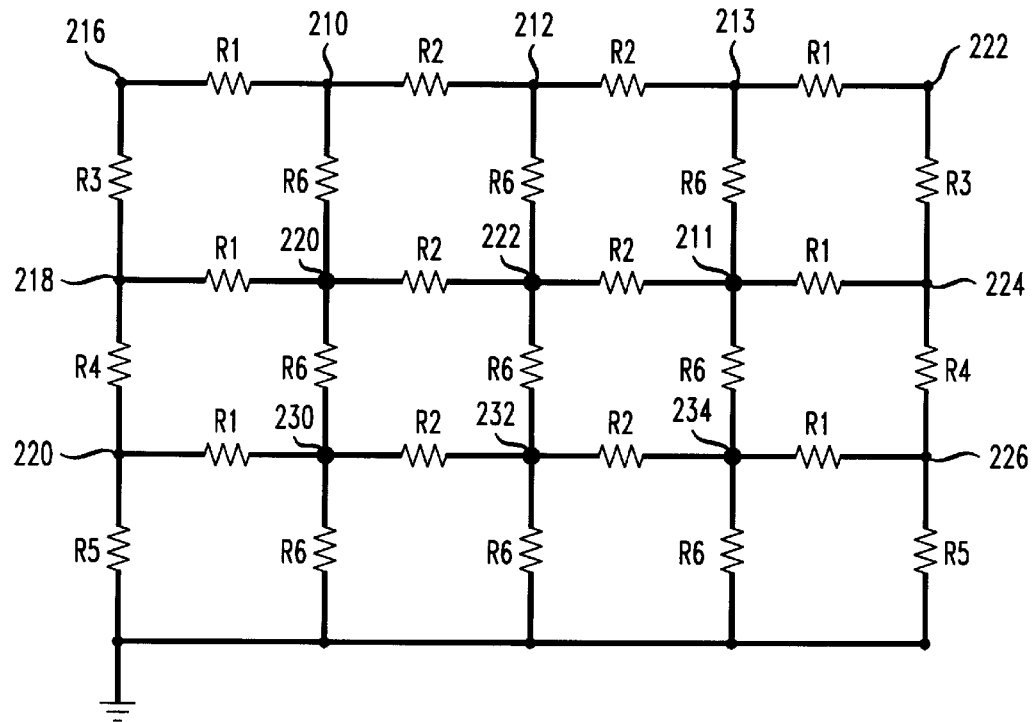
Figure 6C:
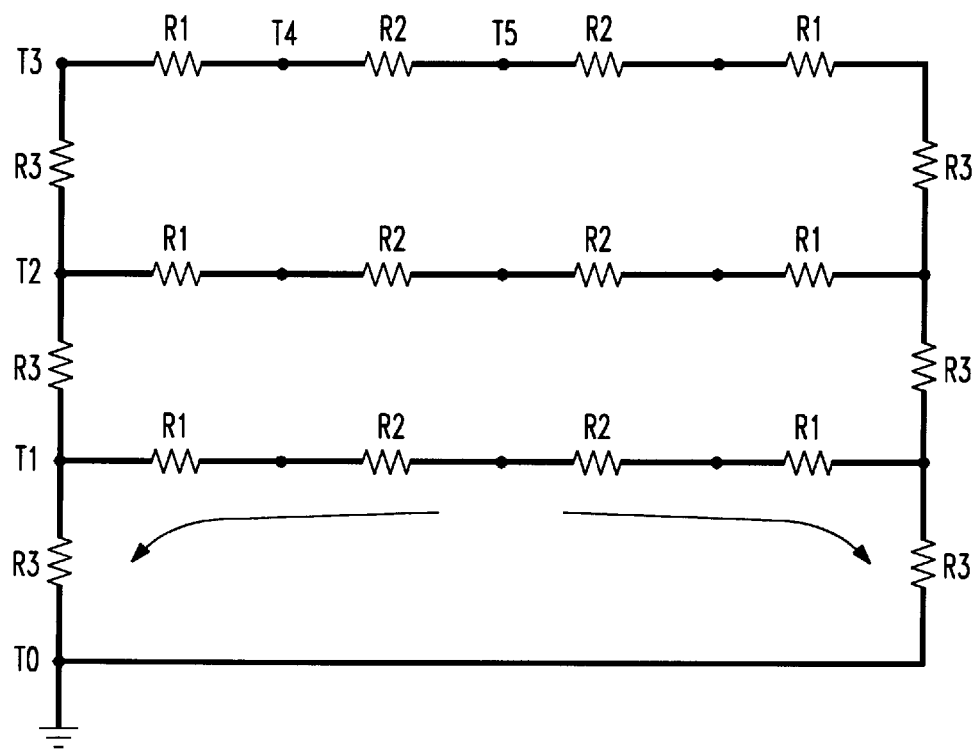

FIGS. 6a–6c illustrate the thermal performance of a 3×3 semiconductor laser array, such as 180, in accordance with one embodiment of the invention. Laser array 180 includes a base plate 182 and three laser bars 184, 188, 196, and three heat spreader plates 186, 190 and 194, and two side walls 42 and 44 as described in reference with FIG. 3.

Figure 6D:
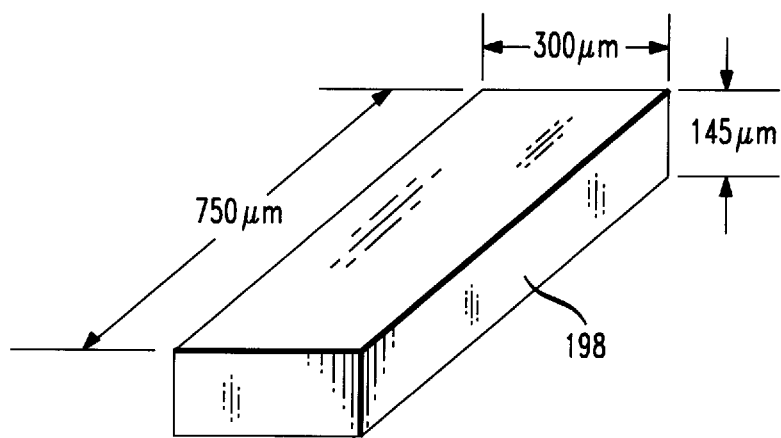

Each laser diode in a laser bar may be represented as a rectangular box, such as 198, as illustrated in FIG. 6d. In accordance with one embodiment of the invention, the laser diode has a length of about 750 $\mu$m, a width of about 300 $\mu$m and a height of about 145 $\mu$m. It is therefore possible to determine the thermal resistance of each laser diode along the direction of heat transfer. For example, the thermal resistance of the rectangular box, such as 198 is $$R_1 = \frac{1}{K*A} \quad (7)$$

where l is the height of the box, and A is the area defined by the width and the length of the box, and K is a heat constant, which among other things depends on the material employed to make the laser diode.

As will be explained in more detail hereinafter, once the thermal resistance is known, it is possible to determine the temperature difference $\Delta T$ between the top layer of the highest heat spreader plate 194 and base plate 182. A substantially low temperature difference allows for higher concentration of laser diodes in a semiconductor laser assembly.

FIG. 6b illustrates a circuit diagram that represents thermal resistances defined by all the components of semiconductor laser array 180. The components of semiconductor laser array 180, such as each laser diode in a laser bar, the portion of the laser bar between two laser diodes and the sidewalls are advantageously approximated to a plurality of rectangular boxes. To this end $R_1$ represents the thermal resistance of a laser diode in a shape of approximately a rectangular box, such as 196, 214, 188, 232, 184 and 238, extending along a direction from a heat spreader plate to a side wall along a laser diode substrate. $R_2$ represents the thermal resistance of a rectangular box defined by portions of two adjacent laser diodes disposed within a laser bar. $R_3$, $R_4$ and $R_5$ each represent the thermal resistance of rectangular boxes defined by portions of each sidewall, wherein each box has a height substantially equal to the height of a laser bar and a heat spreader together. Finally $R_6$ represents the thermal resistance of a rectangular box defined by portions extending from one laser diode on one laser bar to a corresponding laser diode in an adjacent laser bar.

FIG. 6c illustrates a thermal circuit that is equivalent to that of FIG. 6b. As illustrated thermal resistance $R_6$ is omitted from the circuit. This follows because $R_6$ is substantially larger than $R_5$, or $R_4$, or $R_3$. $T_5$ represents the temperature of laser diode 212. $T_4$ represents the temperature of laser diode 210. $T_3$, $T_2$, and $T_1$ represent temperatures along rectangular boxes defined in side walls 42 and 44. Finally, $T_o$ represents the temperature in base plate 182. The temperature differences are derived as $$T_1 - T_0 = \frac{N^2}{2} p_d R_3 \quad T_4 - T_3 = \frac{N-(N-2)}{2} p_d R_1$$

$$T_2 - T_1 = \frac{N-(N-1)}{2} p_d R_3 \quad T_5 - T_4 = \frac{(N-1)(N-2)}{2} p_d R_2$$

$$T_3 - T_2 = \frac{N-(N-2)}{2} p_d R_3$$

where N is the number of laser bars in the laser array and $p_d$ is the thermal power dissipation of a laser diode.

The thermal resistances $R_1$, $R_2$ and $R_3$ are given by $$R_1 = \frac{1}{KA} = \frac{0.025 \text{ cm}}{4.9 \frac{W}{cm \cdot °C} (0.075 \text{ cm} \times 0.0155 \text{ cm})} = 4.4° \text{ C./W} \quad (8)$$

where K is the thermal conductivity of the material, and l is the distance from top surface 194 to middle portion 216 of sidewall 44, and A is the cross section area of surface 194.

$$R_2 = \frac{0.030 \text{ cm}}{4.9 \frac{W}{cm. °C} (0.075 \times 0.0155) cm^2} = 5.3° \text{ C./W} \quad (9)$$

and, $$R_3 = \frac{0.030 \text{ cm}}{4.9 \frac{W}{cm. °C} (0.075 \times 0.1) cm^2} = 0.82° \text{ C./W} \quad (10)$$

Based on the foregoing, the temperature difference between the top laser bar and base plate 182 is $\Delta T = 1.93°$ C. This substantially low temperature difference indicates that it is possible to concentrate a relatively large number of laser diodes in a semiconductor laser array, which is built in accordance with the principles of the present invention.

The reliability and failure rate of the semiconductor laser array in accordance with the present invention is explained in more detail hereinafter. All of the laser diodes of a two-dimensional semiconductor laser array, such as 38 operate satisfactorily, for a given period after its first use. However, after a certain period of time, the laser diodes begin to fail randomly. In order to maintain the same optical power after a failure of a laser diode, the current signal provided to the laser array may be increased. However, as more and more laser diodes fail, the increase in current signal reaches a predetermined threshold level, above which the laser array may not operate reliably.

The failed laser diodes still consume substantially the same electrical power as those laser diodes that are operating, with the exception that they do not emit light. For example, the operating current signal $I_{op,n}$, to maintain the same optical power in an N×N semiconductor laser array after n number of laser diode failures is $$I_{op,n} = \frac{N^2}{N^2 - n} \left( I_{op} - \frac{n}{N^2} I_{th} \right) \quad (11)$$

where $I_{op}$ is the total operating current signal prior to the laser diode failures. The percent change of $I_{op}$ can be expressed as $$\frac{\Delta I_{op,n}}{I_{op}} (\%) = \frac{n}{N^2 - n} \left( 1 - \frac{I_{th}}{I_{op}} \right) 100 \quad (12)$$

The random failure of individual laser diodes in a semiconductor laser array in accordance with the present invention, is advantageously modeled by the exponential distribution. To this end, the probability of a laser failure is a constant designated by $\lambda$. Furthermore, the laser failures are assumed to be independent of each other. This means that the occurrence of a failure does not affect the probability of a failure of an adjacent element although the current to that laser may increase. This allows to model the number of failed lasers as a function of time by the Poisson process. Given the maximum allowable number of failed lasers $n_{max}$, the time t, the number of lasers $N^2$, the probability of $n_{max}$ or less laser failures is advantageously expressed as $$P_r(n \leq n_{max}) = \sum_{i=0}^{n_{max}} \exp - \lambda N^2 t \frac{(\lambda N^2 t)^2}{i!} \quad (13)$$

The probability of success with time, which is also known as the reliability function R (t) of an N×N semiconductor laser array is substantially the same as the value of $P_r(n \leq n_{max})$. To this end, the mean time between failure (MTBF) is equal to the area beneath the curve of the reliability function from t=0 to t=∞, $$MTBF = \int_0^\infty R(t) dt \quad (14)$$

Substituting Eq. (13) into Eq. (14), $$MTBF = \frac{n_{max} + 1}{\lambda N^2} \quad (15)$$

The failure rate is the inverse of MMBF, $$Fr(FIT) = \frac{\lambda N^2}{n_{max} + 1} \quad (16)$$

where FIT is the unit representing one failure in one billion hours. The typical reliability requirement for terrestrial telecommunications applications is less than 1000 FITs.

Based on equations (13) to (16), semiconductor laser arrays in accordance with principles of the present invention and with predetermined electrical characteristics may be designed. For example, a 1 watt semiconductor laser array may be designed as explained hereinafter. First, laser bars are built employing 980 nm InGaAs/GaAs single mode laser diodes available from IBM® Laser Enterprise. The laser diodes have a typical threshold of 15 mA, serial resistance of 1.6Ω, operating current of 173 mA and operating optical power of 150 mW. To achieve 1 W optical power, a 3×3 semiconductor laser array such as 180 (FIG. 6a) is arranged. Table 1 compares the electrical performance of a 3×3 semiconductor laser array in accordance with the exemplary embodiment of the present invention with an exemplary prior art 1 watt semiconductor laser array.

TABLE I

| Device | $L_{op}$ (W) | $I_{op}$ (A) | $V_{op}$ (V) | $I_{th}$ (A) | $P_{op}$ (W) | $\eta_{(E)}$ (%) |
|---|---|---|---|---|---|---|
| 3 × 3 SLA (FIG. 6a) | 1.0 | 0.396 | 4.62 | 0.045 | 0.83 | 55 |
| Prior Art | 1.0 | 1.8 | 1.95 | 0.2 | 2.51 | 29 |

It can be seen that the operating current in accordance with one embodiment of the present invention has been reduced by 4.5 times, and the threshold current has been reduced by 4.4 times. The operating voltage has been increased by 2.4 times to 4.62 V. However, the increase in operating voltage may be a desirable feature since most of the commercial power supplies have an output voltage signal of approximately 5 V. Another important feature of the exemplary 3×3 semiconductor laser array in accordance with the present invention is that the thermal power dissipation is reduced by 3.0 times to 0.83 W. This reduction in thermal power dissipation allows the laser array to be packaged in a standard 14 pin butterfly box like the one described in S. Y. Huang, A. Greenberg, and T. A. Corser, *High Performance Pump Laser Modules for Erbium-Doped Fiber Amplifiers*, Proc. Of 43rd ECTC, pp.968–973, Orlando, Fla. (1993).

Table 2 illustrates a comparison of performance characteristics between a 10 watt semiconductor laser array in accordance with the present invention and an exemplary 10 watt prior art semiconductor laser array. The laser diodes employed in laser bars in accordance with the present invention are the same as employed for the 3×3 laser diode described above.

TABLE II

| Device | $L_{op}$ (W) | $I_{op}$ (A) | $V_{op}$ (V) | $I_{th}$ (A) | $P_{op}$ (W) | $\eta_E$ (%) |
|---|---|---|---|---|---|---|
| 10 × 10 SLA | 10 | 1.20 | 15.2 | 0.15 | 8.24 | 55 |
| Prior Art | 10 | 18 | 1.8 | 8 | 22.4 | 31 |

Compared to the prior art system, the operating current signal in accordance with the principles of the present invention, has been reduced by 15 times, the threshold current signal has been decreased by 53 times, and the thermal power dissipation has been decreased by 2.7 times. The operating voltage signal has been increased to 15.2 V. However, it is relatively easier to provide an increased operating voltage signal than providing 18 amperes current signal in the case of the prior art laser array system.

Figure 7:
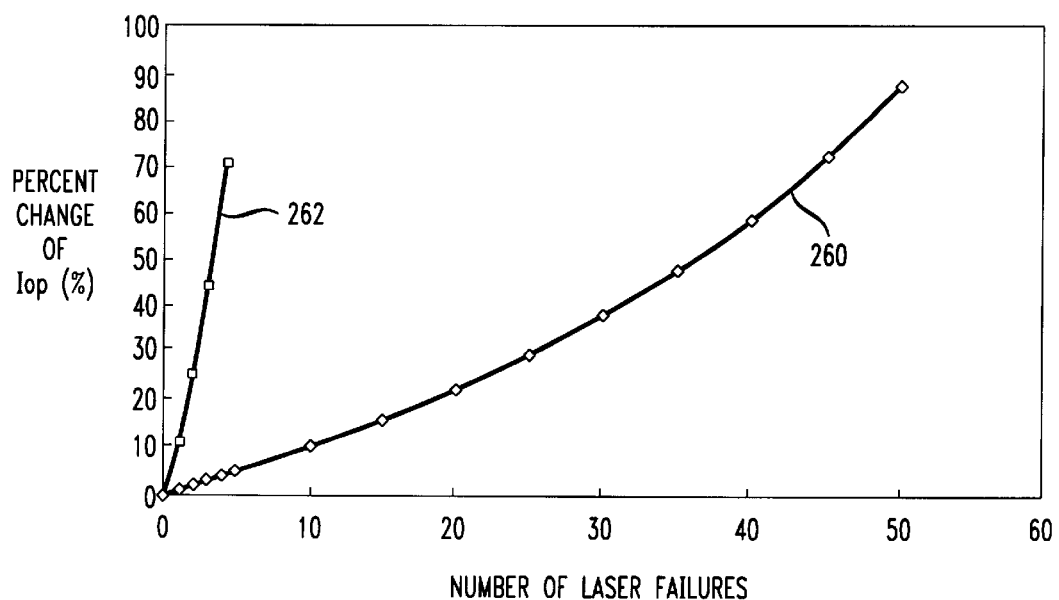
FIG. 7 is a plot representing the number of individual laser failures versus the percent change in current supplied in a semiconductor laser array in accordance with one embodiment of the present invention.

FIG. 7 is a plot illustrating two graphs that represent the percent change of operating current signal $I_{op}$ for a 1 W 3×3 and a 10 W 10×10 semiconductor laser array arranged in accordance with the present invention. Equation (12) governs this operating current signal change. As illustrated graph 262 represents the operation of a 3×3 laser diode array, and graph 260 represents the operation of a 10×10 laser diode array. For both situations, the percent change of operating current signal, $I_{op}$, monotonically increases with the number of laser failures as expected.

Figure 8:
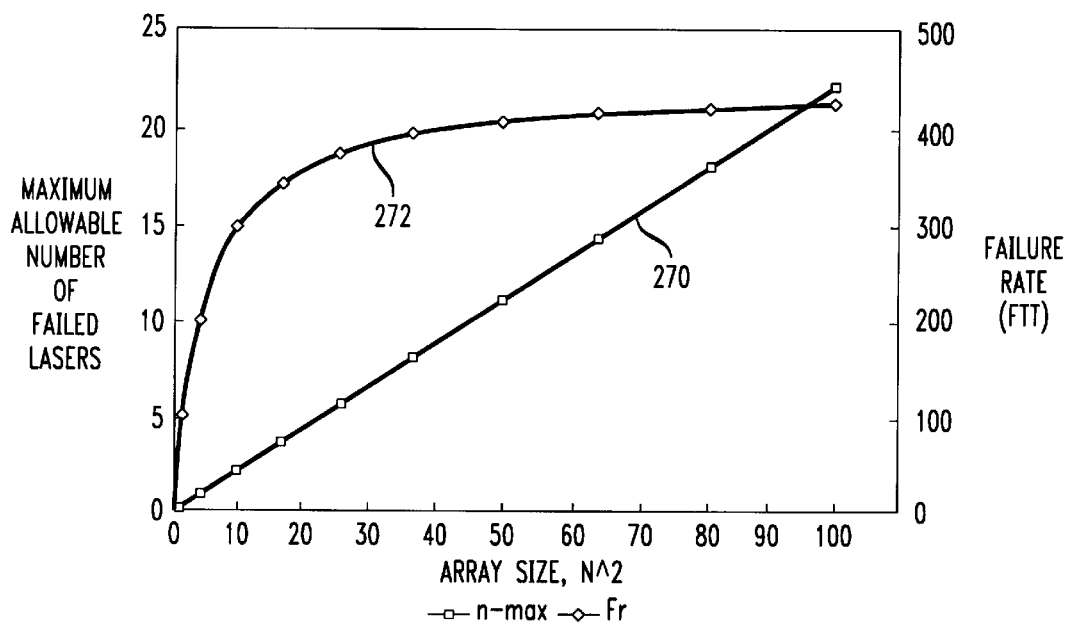
FIG. 8 is a plot representing the array size of a semiconductor laser array in accordance with one embodiment of the present invention versus the maximum allowable number of failed lasers and the failure rate.

The typical end of life condition for a semiconductor laser is defined as the time when the operating current increases by 25% relative to the initial operating current. Under this criterion it is possible to calculate the maximum allowable number of lasers that may fail in any array of any given size. To this end, FIG. 8 illustrates maximum allowable number of failed lasers (graph 270) and the corresponding failure rate (FIT) (graph 272) as a function of array size. Because the relationship of $n_{max}$ and $N^2$ is linear, as illustrated by graph 270, the reliability of semiconductor laser arrays in accordance with the present invention is substantially not sensitive to the array size. This property provides the flexibility to scale up the optical power without compromising the reliability. As illustrated by graphs 270 and 272, the maximum allowable number of failed lasers is 2 for a 3×3 semiconductor laser array and 22 for a 10×10 semiconductor laser array arranged in accordance with the present invention.

It is noted that in accordance with one embodiment of the present invention, it is possible to design a semiconductor laser array based on failure rate (FIT) requirements for a desired application. For a laser bar made of IBM's® 980 nm laser diodes having an operating power of 111 mW, the probability of a single laser failure, λ is 150 FITs. From Eq (16) the failure rate of a 3×3 semiconductor laser array made of this specific laser bar and in accordance with the arrangement illustrated in FIGS. 3 and 6, is 450 FITs. Likewise, in a 10×10 semiconductor laser array in accordance with the present invention, each laser diode operates at 100 mW with the probability of a single laser failure, λ being 99 FITs. The failure rate of this 10×10 semiconductor laser array is 430 FITs as derived by Eq. (16).

As mentioned earlier, the typical reliability requirement for terrestrial telecommunication applications is equal to or less than 1000 FITs. Therefore, semiconductor laser arrays in accordance with the present invention are well suited for terrestrial telecommunication applications, which require a FIT rate of 1000 or less.

The semiconductor laser arrays in accordance with the present invention can meet even more stringent reliability requirements. For example, in undersea applications the reliability requirement is equal to or less than about 40 FITs. This reliability target is achieved by advantageously reducing the optical power of the semiconductor laser array arrangement. As an example, a 10×10 semiconductor laser array in accordance with the present invention is configured to operate at 5.5 W optical power instead of 10 W to bring down the random failure to 40 FITs. Table III illustrates the reliability rates in accordance with the embodiments of the present invention in comparison with prior art laser array systems.

TABLE III

| Device | $L_{op}$ (W) | $I_{op}$ (A) | $V_{op}$ (V) | $I_{th}$ (A) | $P_{op}$ (W) | Fr (FIT) |
|---|---|---|---|---|---|---|
| 3 × 3 SLA | 1.0 | 0.396 | 4.62 | 0.045 | 0.83 | 450 |
| Prior Art | 1.0 | 1.8 | 1.95 | 0.2 | 2.51 | 10000 |
| 10 × 10 SLA1 | 10 | 1.20 | 15.2 | 0.15 | 8.24 | 430 |
| Prior Art | 10 | 18 | 1.8 | 8 | 22.4 | 20000 |
| 10 × 10 SLA2 | 5.5 | 0.73 | 14.5 | 0.15 | 5.1 | 40 |

As illustrated by Table III, for a 1 W 3×3 semiconductor laser array in accordance with the present invention, the reliability improves by 22 times compared with a prior art system, and for a 10 W 10×10 semiconductor laser array, the reliability improves by 47 times compared to a prior art system. Furthermore, by reducing the operating power from 10 W to 5.5 W for a 10×10 semiconductor laser array in accordance with the present invention, the reliability target for undersea applications is within an acceptable range.

Figure 9:
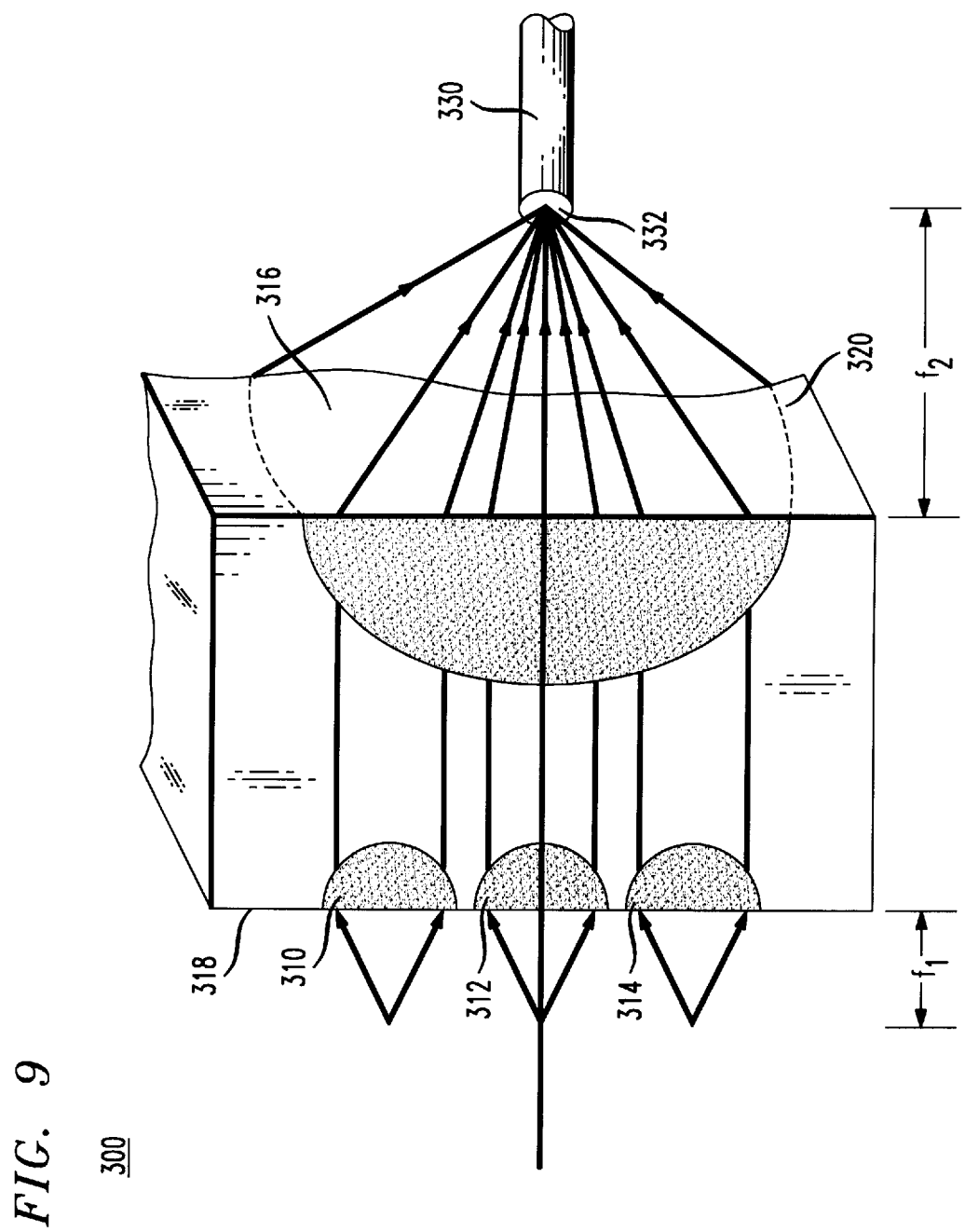
FIG. 9 is a lenslet module in accordance with one embodiment of the present invention, employed to collect light from a semiconductor laser array.

As previously mentioned, the semiconductor laser array in accordance with the present invention may be employed in many applications. In order to be able to convert the lights emitted from each individual laser diode to a focal point efficiently a monolithic lenslet module 300, as illustrated in FIG. 9 is employed in accordance with one embodiment of the invention, although the invention is not limited in scope in that respect.

The arrangement of the monolithic lenslet module 300 is explained in detail in a copending patent application serial no, 08/736,697 filed concurrently herewith and incorportated herein by reference.

Monolithic lenslet module 300 includes a plurality of receiving plano-convex lenses, such as 310, 312 and 314, and one relatively larger emitting plano-convex lens 316. Lenslet module 300 is configured to receive light emitted from individual laser diodes, such as those employed in a semiconductor laser array arranged in accordance with the system described with reference to FIGS. 3 and 6. To this end, lenslet module 300 includes a side wall 318 for receiving light, and a side wall 320 for emitting the light.

The plurality of receiving plano-convex lenses, such as 310, 312 and 314 are disposed within side wall 318, and the number of these lenses corresponds to the number of laser diodes employed in a semiconductor laser array, which provides a plurality of laser lights. For example, lenslet module 300 preferably includes 9 receiving lenses when it is employed to convert light generated by a 3×3 semiconductor laser array described above in reference with FIG. 6.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

I claim:

1. A two dimensional semiconductor laser array comprising:
   a heat conducting base plate;
   a first laser bar disposed over said heat conducting base plate, said first laser bar having a plurality of laser diodes stacked adjacent each other;
   a first heat spreader plate disposed over said first laser bar;
   a second laser bar disposed over said first spreader plate, said second laser bar having a plurality of laser diodes stacked adjacent each other;
   a second heat spreader plate disposed over said second laser bar; and
   at least two spaced apart sidewalls disposed on said heat conducting base plate, said first and second heat spreader plates being sandwiched between and thermally connected to said two sidewalls.

2. A two dimensional semiconductor laser array as defined in claim 1 further comprising a total of three or more laser bars and a total of three or more heat spreader plates, said heat spreader plates stacked upon each other, such that each heat spreader plate is disposed in between two of said laser bars.

3. A two dimensional semiconductor laser array as defined in claim 2, wherein the height of said sidewalls is configured to be substantially equal to the height of the stack formed by said laser bars and said heat spreader plates.

4. A two dimensional semiconductor laser array as defined in claim 2, wherein said laser bars are substantially electrically isolated from said sidewalls.

5. A two dimensional semiconductor laser array as defined in claim 2, wherein said base plate is made of a ceramic material having a substantially high thermal conductivity.

6. A two dimensional semiconductor laser array as defined in claim 5, wherein said side walls are made of a ceramic material.

7. A two dimensional semiconductor laser array as defined in claim 5, wherein said heat spreader plates are made of a ceramic material.

8. A two dimensional semiconductor laser array as defined in claim 2, wherein said individual laser diodes are edge emitting single transverse mode lasers.

9. A two dimensional semiconductor laser array as defined in claim 2, wherein said laser diodes of each one of said laser bars are electrically coupled together in parallel.

10. A two dimensional semiconductor laser array as defined in claim 9, wherein corresponding laser diodes in separate laser bars are electrically coupled together in series, such that the first laser diode in each row is electrically coupled in series to the first laser diode in the following column.

11. A method for fabricating a two dimensional semiconductor laser array comprising the steps of:
    (a) providing a thermally conductive base plate,
    (b) disposing a laser bar having a plurality of laser diodes on substantially the central portion of said base plate;
    (c) disposing a thermally conductive heat spreader plate on said laser bar;
    (d) disposing a second laser bar having a plurality of laser diodes on said heat spreader plate;
    (e) disposing a second thermally conductive heat spreader plate on said second laser bar; and
    (f) disposing a first and second side wall spacially apart from each other on said base plate, such that said first and second heat spreader plates are sandwiched between and are thermally connected to said side walls.

12. A method for fabricating a two dimensional laser array in accordance with claim 11, further comprising the steps of repeating said steps (c) through (d) until a desired number of laser bars and heat spreaders have been stacked together.

13. A method for fabricating a two dimensional laser array in accordance with claim 12, wherein said step of providing a laser bar further comprises the steps of:
    growing a plurality of laser diodes on a semiconductor wafer; and
    slicing said semiconductor wafer into a plurality of said laser bars.

14. A method for fabricating a two dimensional semiconductor laser array as defined in claim 13, wherein said step of growing a plurality of laser diodes further comprises the step of forming said laser diodes based on stripe-geometry technique.

15. A method for fabricating a two dimensional semiconductor laser array as defined in claim 14, wherein after said slicing step, the method further comprises a step of coating the end faces of each laser bar with a high reflective layer on one side and a low reflective layer on the other side.

16. A method for fabricating a two dimensional semiconductor laser array as defined in claim 11, wherein said step of providing a laser bar further comprises the step of providing edge-emitting single transverse mode laser diodes.

17. A method for fabricating a two dimensional semiconductor laser array as defined in claim 12 further comprising a step of substantially electrically isolating said laser bars from said sidewalls.

18. A method for fabricating a two dimensional semiconductor laser array as defined in claim 13, further comprising a step of metallizing said base plate on all sides and coating said base plate with soldered film on the portion having contact with said laser bars.

19. A method for fabricating a two dimensional semiconductor laser array as defined in claim 18 further comprising a step of metallizing said heat spreader plates on all sides and coating said heat spreader plates with soldered film on top and bottom sides.

20. A method for fabricating a two dimensional semiconductor laser array in accordance with claim 18, further comprising the steps of metallizing all portions of said sidewalls and coating with soldered film all portions of said sidewalls having a contact with said heat spreader plates and said base plate.

* * * * *